United States Patent
Wu

(10) Patent No.: US 7,706,767 B2
(45) Date of Patent: Apr. 27, 2010

(54) DUAL PATH LOOP FILTER FOR PHASE LOCK LOOP

(75) Inventor: Yue Wu, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 102 days.

(21) Appl. No.: 11/486,516

(22) Filed: Jul. 13, 2006

(65) Prior Publication Data

US 2007/0298747 A1   Dec. 27, 2007

Related U.S. Application Data

(60) Provisional application No. 60/787,078, filed on Mar. 28, 2006.

(51) Int. Cl.
*H04B 7/00* (2006.01)
(52) U.S. Cl. ............... 455/260; 455/265; 455/180.3; 327/157; 327/156; 327/147; 375/376; 375/375; 375/374
(58) Field of Classification Search ............... 455/260, 455/265, 180.3; 327/157, 156, 147; 375/376, 375/375, 374
See application file for complete search history.

(56) References Cited

U.S. PATENT DOCUMENTS

| | | | |
|---|---|---|---|
| 6,281,758 B1 | 8/2001 | Elsayed et al. | |
| 6,526,113 B1 * | 2/2003 | Gutierrez et al. | 375/376 |
| 6,670,833 B2 * | 12/2003 | Kurd et al. | 327/156 |
| 7,120,217 B2 * | 10/2006 | Schwarzmueller | 375/376 |
| 7,277,518 B2 | 10/2007 | Loke et al. | |
| 7,345,550 B2 | 3/2008 | Bellaouar et al. | |
| 7,436,229 B2 * | 10/2008 | Sidiropoulos et al. | 327/157 |

OTHER PUBLICATIONS

International Search Authority, PCT/US2007/065021 - International Search Authority - European Patent Office - Jul. 24, 2007.
Written Opinion, PCT/US2007/065021 - International Search Authority - European Patent Office - Jul. 24, 2007.

* cited by examiner

*Primary Examiner*—Sanh D Phu
(74) *Attorney, Agent, or Firm*—Howard H. Seo; Ramin Mobarhan

(57) ABSTRACT

A dual path loop filter circuit for a phase lock loop is described. The filter circuit allows the filter to be integrated into a phase lock loop IC circuit without using active circuit components that may create additional noise and consume additional power. The filter circuit structure allows for a low capacitance capacitor to be used to filter out any undesired signals.

20 Claims, 2 Drawing Sheets

DUAL PATH LOOP FILTER FOR PHASE LOCK LOOP

The present Application for patent claims priority to Provisional Application No. 60/787,078 entitled "A method to implementation of PLL dual path loop filter" filed Mar. 28, 2006, and assigned to the assignee hereof and hereby expressly incorporated by reference herein.

FIELD

The present disclosure relates generally to electronics, and more specifically to a dual path loop filter design for phase lock loop circuits.

BACKGROUND

Phase Locked Loop (PLL) circuits are well known and used for frequency control in a variety of applications. For example, they can be configured as frequency multipliers, demodulators, tracking generators or clock recovery circuits. A typical PLL circuit has a loop filter to filter out high frequency components such as spurs generated by a phase comparator or a charge pump in the PLL circuit. A typical loop filter uses passive components such as capacitors and resistors to filter out any undesired signals such as spurs. However, a typical loop filter requires high capacitance capacitor(s) to filter out high frequency components such as spurs. Since high capacitance capacitors occupy large amount of space in integrated circuits, the high capacitance capacitors could not be integrated into integrated circuits that include PLL circuits. As a result, the loop filters were usually located outside of the integrated circuits.

To solve the above problem with loop filters, a dual path loop filter was designed to allow loop filters to be integrated into IC circuits. The dual path loop filter uses active circuit components such as op-amps to filter out unwanted signals. However, active circuit components create additional noise and consume more power than passive circuit components.

Therefore, there is a need in the art for a new type of dual path loop filter design that can ameliorate the shortcomings of previous loop filter designs.

SUMMARY

A PLL circuit is described herein. In an embodiment, the PLL circuit includes a charge pump that has a first output path and a second output path. Each of the output paths output a current signal such that the current from the second output path is less than the current from the first output path by a ratio. The PLL further includes a loop filter coupled to the charge pump for filtering out undesired signals such as spurs. The loop filter includes a resistor and a capacitor coupled to the first output path and another capacitor coupled to a second output path. The PLL circuit also includes a voltage controlled oscillator (VCO) coupled to the loop filter. The VCO includes two varactors that are coupled to the first output path and the second output path.

Various aspects and embodiments of the inventions are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
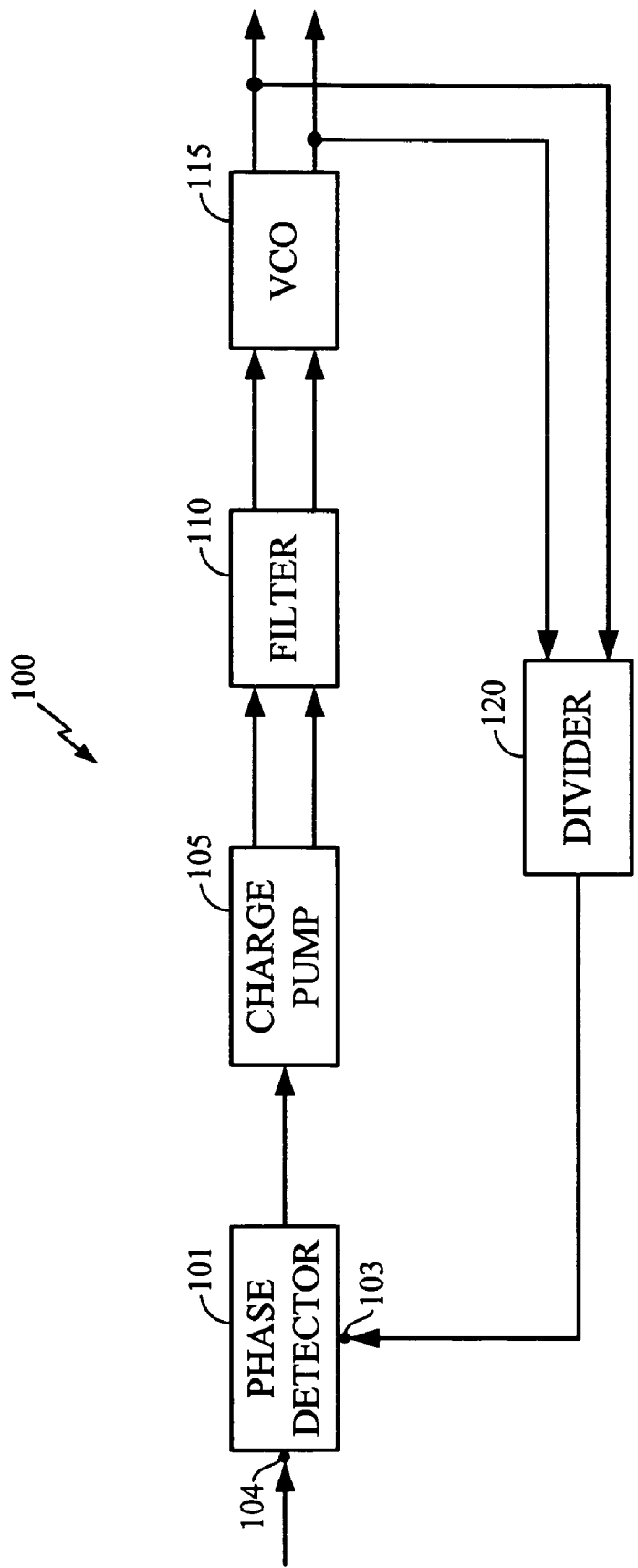
FIG. 1 shows a block diagram of a PLL circuit.

FIG. 1 shows a block diagram of a PLL circuit 100 in accordance with an embodiment. A phase detector 101 receives a reference input signal at an input 104. The reference input signal may be a local oscillator signal produced by a local oscillator in a receiver or may be any other type of signal that the PLL circuit 100 is tracking. An input 103 of the phase detector 101 receives an output from a divider 120 that reduces the frequency of the output signal from a voltage controlled oscillator (VCO) 115. The phase detector 101 determines a phase difference between the reference input signal and the output signal from the divider 120 and produces an output based on the phase difference. The output from the phase detector 101 is a voltage signal that is proportional to the phase difference and controls the charge pump 105. The charge pump 105 receives the output from the phase detector 103 and outputs a differential/dual current signal that is proportional to the phase difference.

A dual path loop filter 110 receives the differential current output from the charge pump 105 and filters out any undesired signals such as spurs. The VCO 115 receives the output from the filter 110 and outputs a signal with a frequency and/or phase controlled by the input signal from the filter 110. Basically, the frequency/phase of the output signal from VCO 115 is altered in response to the phase difference detected by the phase detector 101. The divider 120 receives the output signal from the VCO 115 and divides the frequency of the signal received from the VCO 115. The divider 120 outputs the frequency divided signal to the phase detector 101. Thus, the phase detector 101, charge pump 105, filter 110, VCO 115 and divider 120 form a feedback loop to track and lock the output of the VCO 115 to the reference input signal.

Figure 2:
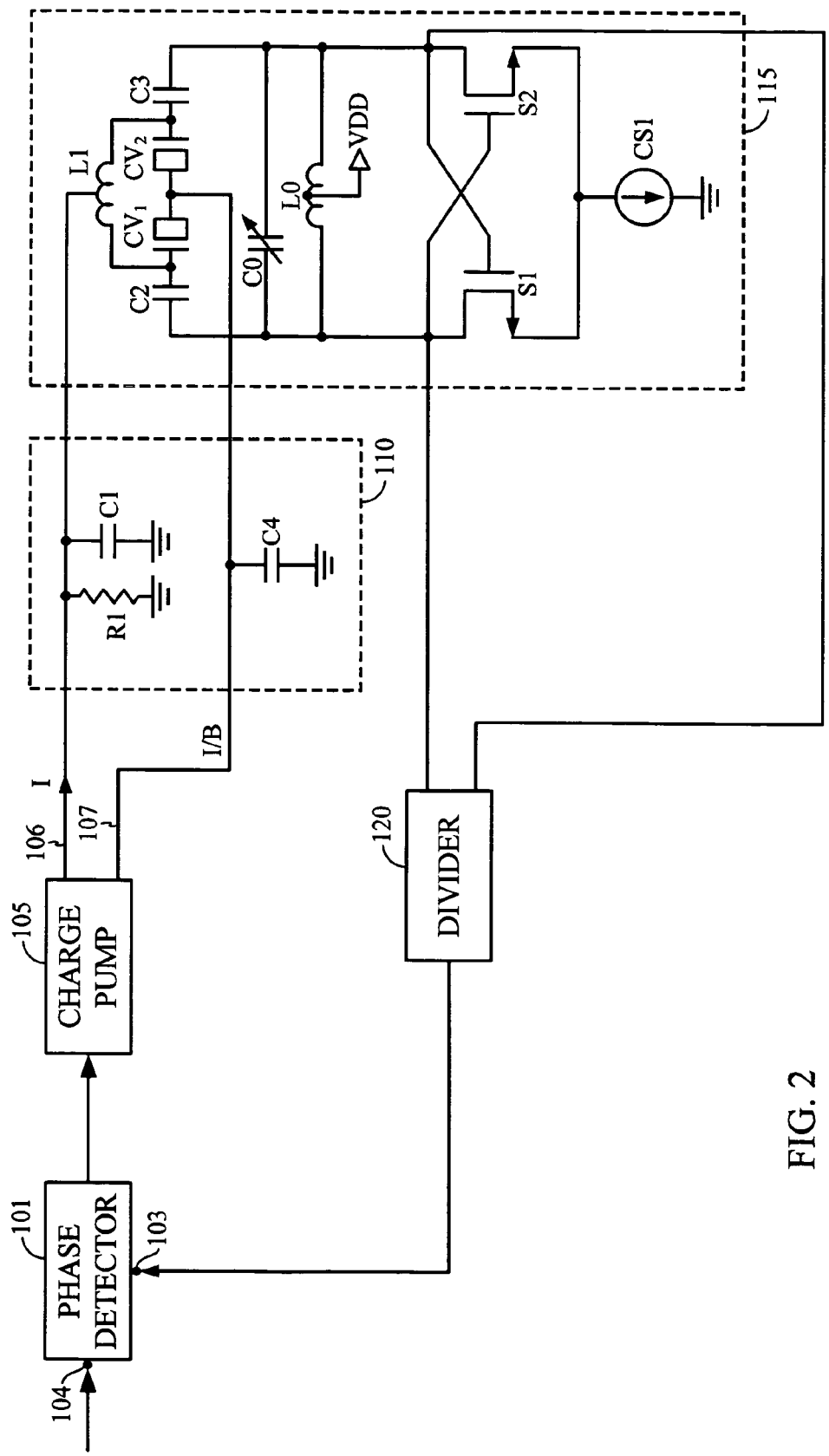
FIG. 2 shows a detailed circuit diagram of the PLL circuit.

FIG. 2 shows the PLL circuit 100 in more detail. Specifically, FIG. 2 shows the circuitry for the dual path loop filter 110 and the VCO 115 in detail. The filter 110 includes a resistor R1 and capacitors C1 and C4. The VCO 115 includes a choke L1, varactors CV1 and CV2, capacitors C0, C2 and C3, an inductor L0, a current source CS1 and transistors S1 and S2.

As described above, the charge pump 105 has a differential/dual output with an output path 106 and an output path 107. As shown in FIG. 2, the resistor R1 and the capacitor C1 are coupled between the output path 106 and the ground, and the capacitor C4 is coupled between the output path 107 and the ground. The output path 106 is coupled to the choke L1, and one end of the choke L1 is coupled to a gate of the varactor CV1 and the other end is coupled to the gate of the varactor CV2. The output path 107 is coupled to the drains of the varactors CV1 and CV2. The drains of the varactors CV1 and CV2 are coupled together.

The capacitance of varactors CV1 and CV2 varies depending on the voltage difference between the drain and the gate of the varactors CV1 and CV2. CVgd shall be used to designate the voltage across the varactors CV1 and CV2 (i.e., $CVgd = V_{gate} - V_{drain}$ and CVgd of CV1 equals CVgd of CV2). Thus, the capacitance of varactors CV1 and CV2 is proportional to CVgd.

The charge pump 105 is designed such that the output path 106 outputs a current of value I and the output path 107 outputs a current of value I/B where B>1 (the value of B will be explained in detail below), and the current flow direction is opposite to each other (e.g., if current I flows toward the VCO 115, then current I/B flows into the charge pump 105.) Assume that Z1=impedance of R1 and C1 together and Z2=the impedance of C4, then CVgd=(I*Z1)−(−I/B*Z2)=I*Z1+I/B*Z2 since the choke L1 acts as a short circuit in low frequency. The previous equation shows that the capacitance of the varactors CV1 and CV2 is controlled by the amount of current I and I/B. Since the phase difference between the reference input signal and the output signal from the VCO 115 controls the amount of current I outputted by the charge pump 105, the phase difference controls the capacitance of CV1 and CV2.

The inductor L0 and capacitor C0 determine the central output frequency of the VCO 115, but the capacitance of the varactors CV1 and CV2 is varied to vary the output frequency of the VCO 115 as shown by the following equation:

$$\omega = \frac{1}{\sqrt{L0 * C_{total}}} = \frac{1}{\sqrt{L0 * C0 * \left(1 + \frac{C_v}{C0}\right)}} = \frac{1}{\sqrt{L0 * C0}} * \left(1 - \frac{C_v}{2C0}\right)$$

where $C_v$=the total capacitance of CV1 and CV2, $\omega$=the output frequency of the VCO 115, $C_v \propto CVgd$, thus $\omega \propto CVgd$.

Furthermore, as stated above, the output path 107 outputs a current of value I/B where B>1. The value for "B" is chosen such that the capacitance of C4 is reduced to a point where the capacitor C4 can be integrated into the main IC circuit that includes the PLL circuit 100. As explained above, in a conventional PLL circuit, the capacitance of a capacitor forming a part of a loop filter is so large that the capacitor cannot be integrated into the main IC circuit and must be external to the main IC circuit. However, in a PLL circuit in accordance with an embodiment, the capacitance of C4 is smaller by a factor of B in comparison to a capacitor in a loop filter of a conventional PLL circuit. By carefully choosing a value for B, the capacitance of capacitor C4 can be reduced so that the capacitor C4 can be integrated into the main IC circuit. Thus, the structure of the PLL circuit 100 allows the dual path loop filter 110 to be formed without using a large capacitor that must be external to the main IC circuit and allows the dual path loop filter 110 to be formed without any active circuit elements that may cause additional noise and increase power consumption.

The capacitors C2 and C3 are coupled to the gates of the varactors CV1 and CV2 and act as AC coupling capacitors that isolate any DC path to the gates of the varactors CV1 and CV2 (e.g., prevent the short of VDD to the gates). The transistors S1 and S2 are cross coupled to each other so that they provide positive feedback to each other to cause and maintain oscillation. A current source CS1 is coupled to the drains of the transistors S1 and S2 and to the ground, as shown in FIG. 2.

The PLL circuit described herein may be used for various communication systems. For example, the PLL circuit may be used for Code Division Multiple Access (CDMA) systems, Time Division Multiple Access (TDMA) systems, Frequency Division Multiple Access (FDMA) systems, Orthogonal Frequency Division Multiple Access (OFDMA) systems, multiple-input multiple-output (MIMO) systems, wireless local area networks (LANs), and so on. A CDMA system may implement a radio access technology (RAT) such as Wideband CDMA (W-CDMA), cdma2000, and so on. RAT refers to the technology used for over-the-air communication. A TDMA system may implement a RAT such as Global System for Mobile Communications (GSM). Universal Mobile Telecommunication System (UMTS) is a system that uses W-CDMA and GSM as RATs. The PLL circuit may also be used for various frequency bands such as, for example, a cellular band from 824 to 894 MHz, a Personal Communication System (PCS) band from 1850 to 1990 MHz, a Digital Cellular System (DCS) band from 1710 to 1880 MHz, an International Mobile Telecommunications-2000 (IMT-2000) band from 1920 to 2170 MHz, and so on.

The PLL circuit described herein may be implemented within an integrated circuit (IC), an RF integrated circuit (RFIC), an application specific integrated circuit (ASIC), a printed circuit board (PCB), an electronic device, and so on. The PLL circuit may also be fabricated with various IC process technologies such as complementary metal oxide semiconductor (CMOS), N-channel MOS (N-MOS), P-channel MOS (P-MOS), bipolar junction transistor (BJT), bipolar-CMOS (BiCMOS), silicon germanium (SiGe), gallium arsenide (GaAs), and so on.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. A circuit comprising:
   a charge pump having a first output path outputting a first current and a second output path outputting a second current;
   a loop filter coupled to the charge pump for filtering undesired signals, the loop filter comprising:
   a resistor coupled to the first output path,
   a first capacitor coupled to the first output path, and
   a second capacitor coupled to a second output path; and
   a voltage controlled oscillator (VCO) coupled to the loop filter, the VCO comprising:
   a first varactor having a gate coupled to the first output path and a drain coupled to the second output path, and
   a second varactor having a gate coupled to the first output path and a drain coupled to the second output path,
   wherein the second current is less than a first current by a ratio.

2. The circuit of claim 1, wherein the second output path is coupled to a node in between the drains of the first and second varactors.

3. The circuit of claim 2, wherein the capacitance of the first and second varactors is varied by varying the amount of first and second currents.

4. The circuit of claim 3, wherein the variance of the capacitance of the first and second varactors changes a frequency or a phase of an output signal of the VCO.

5. The circuit of claim 4, wherein the VCO further comprises:

a choke coupled to the first output path, first varactor and second varactor; and a third capacitor and an inductor coupled to the first and second varactors for determining a central frequency of the output signal of the VCO.

6. The circuit of claim 5, wherein the VCO further comprises:

a first transistor and a second transistor cross coupled to each other for providing a positive feedback that causes the oscillation of the output signal of the VCO.

7. The circuit of claim 6, further comprising:

a phase detector that determines a phase difference between a reference input signal and the output signal of the VCO, wherein the phase detector outputs a control signal to the charge pump which reflects the phase difference.

8. The circuit of claim 7, wherein the charge pump varies the amount of the first and second currents based on the control signal.

9. The circuit of claim 8, further comprising a divider for dividing the frequency of the output signal of the VCO.

10. A circuit comprising:

a charge pump having a first output path outputting a first current and a second output path outputting a second current;

a loop filter coupled to the charge pump for filtering undesired signals;

a voltage controlled oscillator (VCO) coupled to the loop filter, the VCO comprising:

a first varactor having a gate coupled to the first output path and a drain coupled to the second output path, and a second varactor having a gate coupled to the first output path and a drain coupled to the second output path, wherein the second current is less than a first current by a ratio and wherein the second output path is coupled to a node in between the drains of the first and second varactors.

11. The circuit of claim 10, wherein the capacitance of the first and second varactors is varied by varying the amount of first and second currents, and wherein the first current and second current flow in opposite direction.

12. The circuit of claim 11, wherein the variance of the capacitance of the first and second varactors changes a frequency or a phase of an output signal of the VCO.

13. The circuit of claim 12, further comprising:

a phase detector that determines a phase difference between a reference input signal and the output signal of the VCO, wherein the phase detector outputs a control signal to the charge pump that controls the amount of the first current and the second current based on the phase difference.

14. A circuit comprising:

means for charge pumping having a first output path outputting a first current and a second output path outputting a second current;

means for loop filtering coupled to means for charge pumping charge pump for filtering undesired signals, the means for loop filtering comprising:

a resistor coupled to the first output path, a first capacitor coupled to the first output path, and a second capacitor coupled to a second output path; and a voltage controlled oscillator (VCO) coupled to the means for loop filtering, the VCO comprising:

a first varactor having a gate coupled to the first output path and a drain coupled to the second output path, and a second varactor having a gate coupled to the first output path and a drain coupled to the second output path, wherein the second current is less than a first current by a ratio.

15. The circuit of claim 14, wherein the second output path is coupled to a node in between the drains of the first and second varactors.

16. The circuit of claim 15, wherein the capacitance of the first and second varactors is varied by varying the amount of first and second currents.

17. The circuit of claim 16, wherein the variance of the capacitance of the first and second varactors changes a frequency or a phase of an output signal of the VCO.

18. The circuit of claim 17, wherein the VCO further comprises:

a choke coupled to the first output path, first varactor and second varactor; and a third capacitor and an inductor coupled to the first and second varactors for determining a central frequency of the output signal of the VCO.

19. The circuit of claim 18, wherein the VCO further comprises:

a first transistor and a second transistor cross coupled to each other for providing a positive feedback that causes the oscillation of the output signal of the VCO.

20. The circuit of claim 19, further comprising:

means for phase detecting that determines a phase difference between a reference input signal and the output signal of the VCO, wherein means for phase detecting outputs a control signal to the charge pump which reflects the phase difference.

* * * * *